United States Patent [19]

Okumura

[11] Patent Number: 5,164,814
[45] Date of Patent: Nov. 17, 1992

[54] SEMICONDUCTOR DEVICE WITH CUSTOMIZED WIRING

[75] Inventor: Katsuya Okumura, Yokohama, Japan

[73] Assignee: Kabushiki Kaisha Toshiba, Kawasaki, Japan

[21] Appl. No.: 759,818

[22] Filed: Sep. 4, 1991

Related U.S. Application Data

[63] Continuation of Ser. No. 495,082, Mar. 19, 1990, abandoned.

[30] Foreign Application Priority Data

Mar. 20, 1989 [JP] Japan .................................. 1-68826

[51] Int. Cl.⁵ .................... H01L 23/48; H01L 27/10; H01L 27/02; H01L 29/04
[52] U.S. Cl. .................... 257/390; 365/104; 257/758; 257/530
[58] Field of Search ...................... 357/45, 68, 42, 596

[56] References Cited

U.S. PATENT DOCUMENTS 4,673,966 6/1987 Shimoyama .......................... 357/45

Primary Examiner—Rolf Hille
Assistant Examiner—Robert Limanek
Attorney, Agent, or Firm—Finnegan, Henderson Farabow, Garrett and Dunner

[57] ABSTRACT

A semiconductor device has a semiconductor substrate, MOS transistors formed in the semiconductor substrate, a wiring pattern formed on the semiconductor substrate, for wiring the MOS transistors, and a passivation layer covering the wiring pattern. In the semiconductor device, the wiring pattern includes a plurality of connecting sections each selectively set to a conductive state by conductive material filled in an opening formed in the insulating layer.

15 Claims, 3 Drawing Sheets

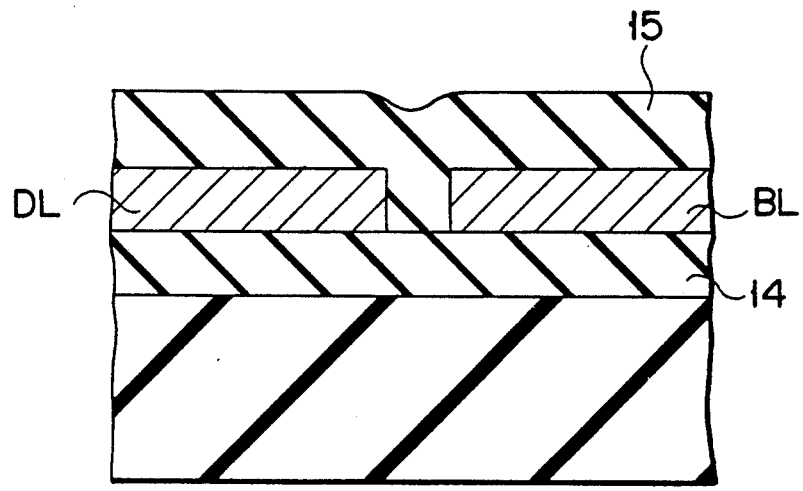
F I G. 4
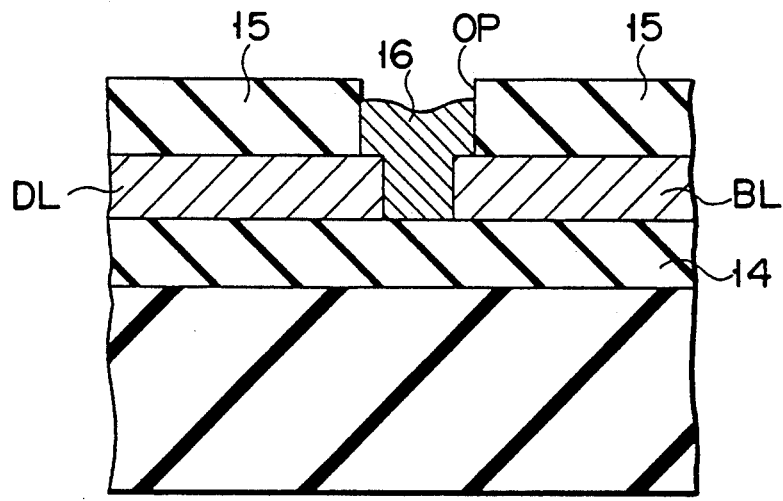
F I G. 5

SEMICONDUCTOR DEVICE WITH CUSTOMIZED WIRING

This application is a continuation of application Ser. No. 07/495,082 filed Mar. 19, 1990 now abandoned.

BACKGROUND OF THE INVENTION

1. Field of the invention

This invention relates to a semiconductor device, and more specifically to a semiconductor device to be customized with a use of wirings.

2. Description of the Related Art

Recently, there is a remarkable increase in the integration density of semiconductor devices. This increase tends to cause the manufacturing process of the semiconductor device quite complex. Regarding custom products, the complex manufacturing process results not only in a higher manufacturing cost but also a longer delivery time than non-custom products. In an attempt to overcome these drawbacks, many suppliers design basic circuit modules, such as a gate circuit, memory cells, a decoder, and a CPU, which are formed on the semiconductor substrate as a gate array or an ASIC (Application Specific Integration Circuit), and connect these modules to one another in accordance with the customer's order. In this way, the manufacturing cost of the custom product can be lowered and the time required for delivery shortened in comparison with the case where circuit modules are customs-designed for each and every customer, upon receipt of an order.

An example of a custom product is a semiconductor memory device which is programmed by the manufacture himself; for example, a mask ROM. A typical mask ROM comprises a plurality of memory cells each of which is constituted by, for example, an MOS transistor, each MOS transistor having a gate connected so as to receive a reading voltage, a source connected to a reference potential terminal, and a drain selectively connected to a data output line, in accordance with data "1" or "0" in the programming. The data output line is connected to the power source potential terminal via a load circuit. The reading voltage is applied to one of the MOS transistors during the reading operation, so that the MOS transistor is in an ON state. At this time, the data output line is set at a potential equal to that of the reference potential terminal if the drain of the MOS transistor is connected to the data output line, and at a potential equal to that of the power source potential terminal if the drain is open.

Semiconductor memory devices such as that described above are often incorporated in equipment which is in temporary demand. Consequently, the volume of sales of such equipment may well depend on the speed at which the semiconductor memory device in question can be delivered. Therefore, it is necessary that such a semiconductor memory device be able to be delivered within a much shorter period of time than standard custom products.

However, the conventional custom semiconductor memory device requires a relatively large number of manufacturing steps following the reception of an order; i.e., the step of depositing an aluminum layer on the semiconductor structure including memory cells; patterning the aluminum layer to form a wiring pattern including wiring lines for connecting memory cells storing data "1" to the data output line; forming a passivation layer which covers the wiring lines; forming openings in the passivation layer so that part of the wiring pattern can be used as a bonding pad. Because of the number of the steps involved, it is therefore difficult to deliver a conventional semiconductor memory device to the customer within a relatively short period of time.

SUMMARY OF THE INVENTION

The object of the present invention is to provide a semiconductor device which, upon receipt of an order, can be customized in a small number of manufacturing steps.

This object is achieved by a semiconductor device comprising: a semiconductor substrate; semiconductor elements formed in the semiconductor substrate; a wiring pattern formed on the semiconductor substrate, for wiring the semiconductor elements; and an insulating layer covering the wiring pattern, wherein the wiring pattern includes a plurality of connecting sections each selectively set to a conductive state by conductive material filled in an opening formed in the insulating layer.

The semiconductor device thus arranged is customized by forming the openings in the insulating layer and supplying conductive material into the openings after receipt of an order. Since the wiring pattern and the insulating layer are formed beforehand, it is therefore not necessary to perform the steps of depositing a conductive layer on the substrate, patterning the conductive layer as wiring, and forming an insulating layer which covers the patterned conductive layer. Hence, the semiconductor device of the present invention can be delivered within a short period of time following the receipt of an order therefor.

BRIEF DESCRIPTION OF THE DRAWINGS

FIGS. 4 and 5 show steps of forming openings for programming, shown in FIG. 3 by a broken circular line;

DETAILED DESCRIPTION OF THE PREFERRED EMBODIMENT

Figure 1:
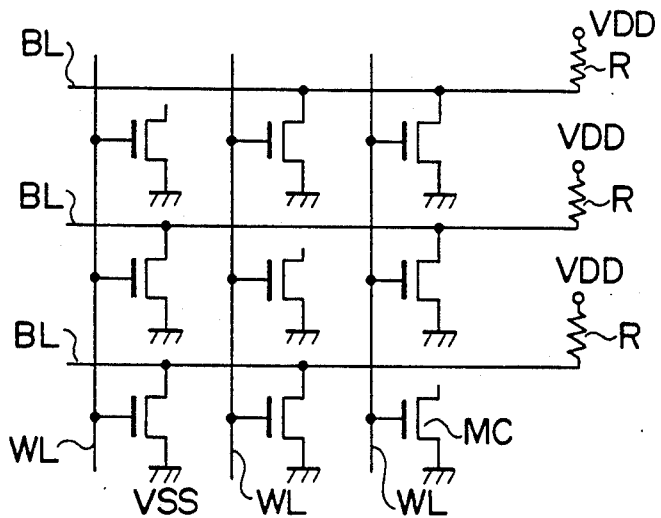
FIG. 1 is a schematic diagram showing the circuit structure of a semiconductor memory device according to an embodiment of the present invention.
Figure 2:
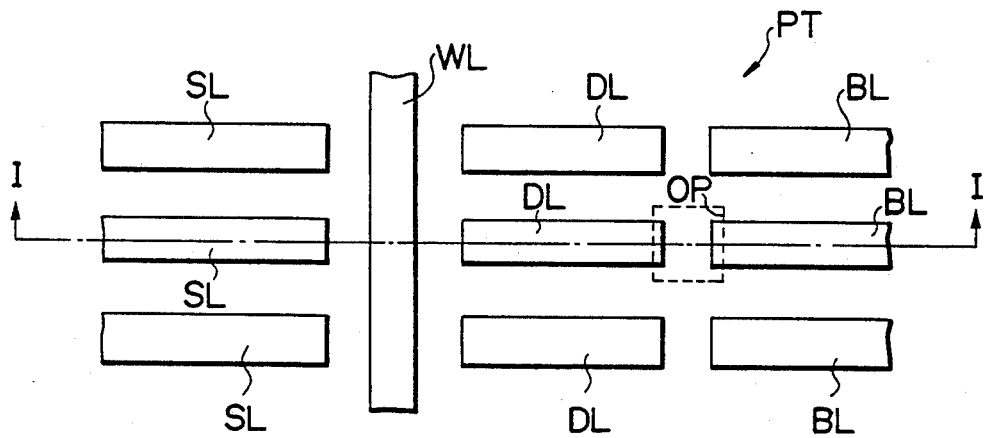
FIG. 2 is a plan view showing part of a wiring pattern of the semiconductor memory device shown in FIG. 1.

The semiconductor memory device according to an embodiment of the present invention will now be described below with reference to FIGS. 1 to 7. FIG. 1 is a schematic diagram showing the circuit structure of the semiconductor memory device, FIG. 2 is a plan view showing part of the wiring pattern of the semiconductor memory device, and FIG. 3 is a cross sectional view showing the semiconductor memory device taken along the line I—I in FIG. 2.

The semiconductor memory device of the present invention has a plurality of n-channel MOS transistors MC arranged in a matrix fashion and each serving as a memory cell, a plurality of word lines WL extending in row directions, and a plurality of bit lines BL extending in column directions. Each of the bit lines BL is connected to power source potential terminal VDD set at a power source level (=5 V) via load resistance R. Each of the MOS transistors MC has a source connected to a reference potential terminal VSS set at the ground level (=0 V), a gate connected to a corresponding word line WL, and a drain to be selectively connected to a corresponding bit line BL in programming. In FIG. 1, the semiconductor memory device is in a programmed state.

The operation of the device thus arranged will now be described. When a reading voltage is applied to one of the word lines WL, the MOS transistors MC connected to the word line WL are turned on. At this time, the potential of each bit line BL depends on whether or not the drain of a corresponding MOS transistor MC is connected to the bit line BL. If the MOS transistor MC is connected to the bit line BL, the potential of the bit line BL is set at the ground level, whereas if the MOS transistor MC is not connected to the bit line BL, the potential thereof is set at the power source level.

Figure 3:
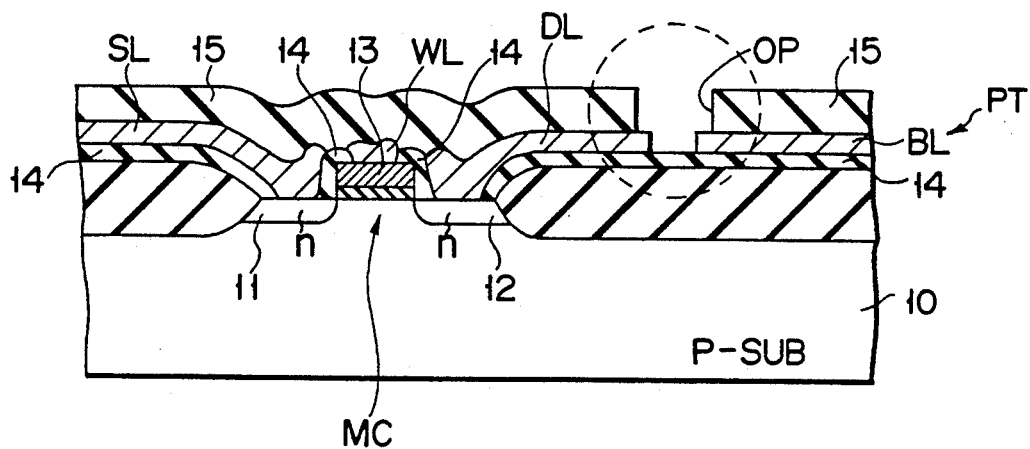
FIG. 3 is a cross sectional view showing the structure of the semiconductor memory device shown in FIG. 2 taken along the line I—I.

In the semiconductor device, as shown in FIG. 3, the source and drain of the MOS transistor MC are constituted by n-type semiconductor regions 11 and 12 formed in the surface region of p-type semiconductor substrate 10, respectively. The gate of the MOS transistor MC is constituted by a gate electrode layer 13 formed on and insulated from that portion of substrate 10 which is located between semiconductor regions 11 and 12. The semiconductor memory device has an aluminum wiring pattern PT formed on $SiO_2$ insulating layer 14 covering the semiconductor regions 11 and 12 and the gate electrode 13. The wiring pattern PT includes lines serving as source electrode SL, word line WL, drain electrode DL, and bit lines BL, as shown in FIG. 2. The source electrodes SL, the word lines WL, and the drain electrodes DL are respectively connected to the semiconductor region 11, the gate electrode 13, and the semiconductor region 12 via contact holes formed in the insulating layer 14.

The structure of the semiconductor memory device will now be described, together with the manufacturing steps.

Each of the lines in the Al wiring pattern PT is 0.8 μm thick, in 0.7 μm width, with the interval between the lines also being 0.7 μm. Similarly, the interval between the drain electrode DL and the bit line BL is 0.7 μm. As shown in FIG. 4, a passivation layer 15 is accumulated on the Al wiring pattern PT by means of an ordinary CVD method or a vacuum CVD method, so as to have a thickness of 1.2 μm. The passivation layer 15 has a double-layer structure including, for example, a PSG layer and a plasma SiN layer.

The above described steps are performed prior to any order for device being received. After receipt of a customer order, programming for storing data "1" or "0" into each of the memory cells in the semiconductor memory device is performed. That is, the passivation layer 15 is etched by isotropic etching or anisotropic etching, so that openings OP are formed over the memory cells selected by the customer order. In the etching process, the size of the openings OP is set larger than 0.7 μm, i.e. the interval between the drain electrode DL and the bit line BL; for example, at 1 μm×1 μm. For this reason, the end portions of the drain electrode DL and the bit line BL are exposed via the opening OP. In forming an opening OP, a mask alignment error may often occur. Hence, the size of the opening OP is set sufficiently large in consideration of such error, to ensure that the end portions of the drain electrode DL and the bit line BL are exposed.

Thereafter, a contact layer 16 is formed in the opening OP to connect the drain electrode DL and the bit line BL. The contact layer 16 is formed by means of a selective CVD method utilizing the reaction between WF and H or WF and SiH, in which W is selectively deposited to the exposed portion of the drain electrode DL and the bit line BL. In this step, W is deposited at the same rate both on the end surface of the drain electrode DL and the end surface of the bit line BL. This causes a W layer to grow in a direction from the inner surface of the opening OP toward the center thereof. Hence, when the thickness of the W layer reaches 0.35 μm, half the interval of the lines in the pattern, 0.7 μm, the drain electrode DL and the bit line BL are connected. In this embodiment, to ensure the above connection, the W layer is formed 0.6 μm thick. Although W is deposited by means of the selective CVD method in this embodiment, metal material such as Ni may be selectively deposited on the Al layer by means of electroless plating. In the step of forming contact layer 16, the metal material is not accumulated on passivation layer 15. Hence, a reliable contact can be obtained between the drain electrode DL and the bit line BL.

Figure 6:
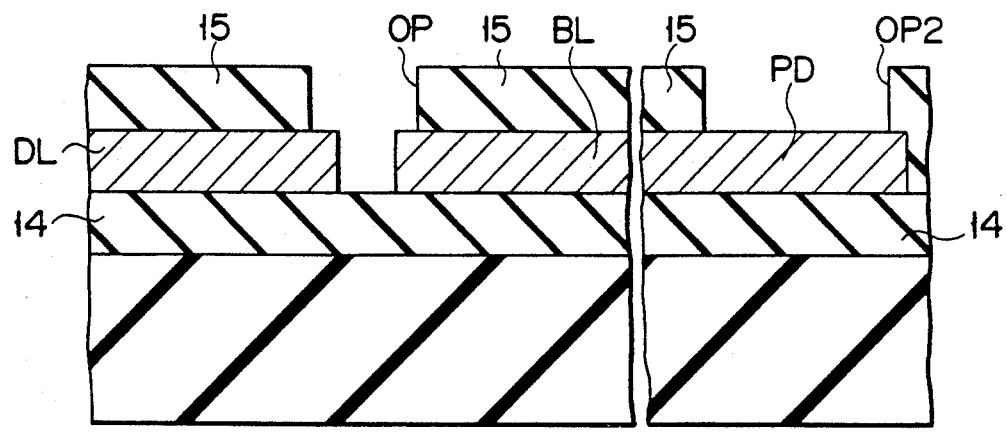
FIG. 6 shows an opening for a bonding pad formed simultaneous with the openings for programming shown in FIG. 4.

In addition, as is obvious from FIG. 6, the opening OP may be formed in the same manufacturing step as that for forming opening OP2 for exposing bonding pad PD covered by the passivation layer 15. Therefore, an additional manufacturing step is not required to form the opening OP.

Figure 7:
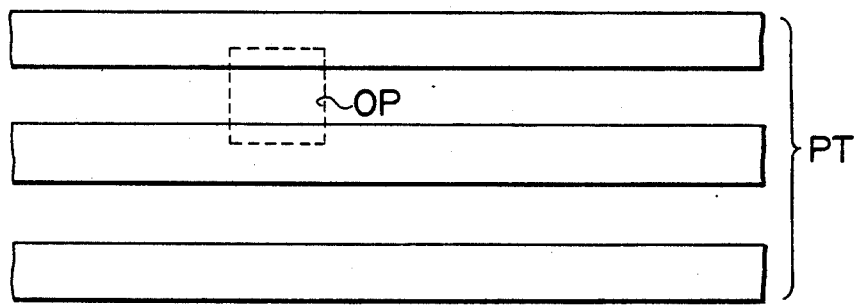
FIG. 7 shows an example of an opening formed in a case where wiring lines arranged in parallel are selectively connected to one another.

In the above-described embodiment, an opening OP is formed to expose portions of the drain electrode DL and the bit line BL. However, as shown in FIG. 7, an opening may be formed to expose portions of any two wiring lines which are selectively connected to each other, upon receipt of customer's order.

In connection with the distance between the exposed portions of the wiring lines, it is set as shorter as possible since the deposition of the conductive material must be continued until the wiring lines are connected to each other. In a case where the distance is set less than the thickness of the passivation layer, the contact layer formed by the deposition ca be prevented from spreading out from the opening OP. Further, when the opening is set small in accordance with the distance between the wiring lines, it is possible to connecting the wiring layer without forming any gap within the contact layer, which may increase the contact resistance between the wiring lines. Therefore, the distance between the wiring lines and the size of the opening OP must be determined according to a design rule for the wiring lines.

Figure 8:
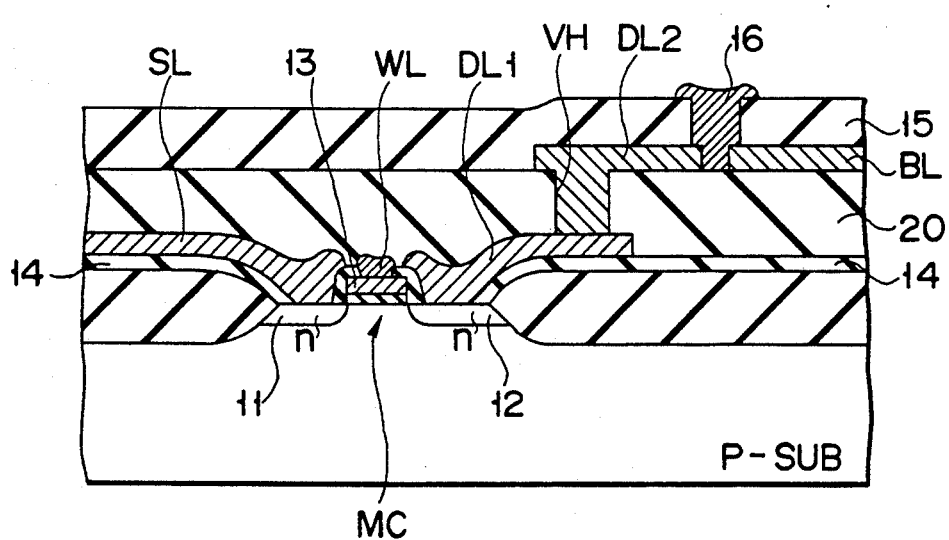
FIG. 8 shows an example of a multi-layered structure of the semiconductor memory device to which the present invention is applied.

In the above-described embodiment, a semiconductor memory device is manufactured in a full-custom manner. However, the present invention can be applied to a semiconductor memory device manufactured in a semi-custom manner, which uses a gate array, a sea of gates, or the like. FIG. 8 shows an example in which a gate array is used. In this case, the semiconductor memory device has a multi-layered structure. That is, the drain electrode DL is constituted by first layer DL1 and second layer DL2, which are connected via contact hole VH formed in interlayer insulating layer 20.

As has been described above, a wiring pattern and a passivation layer are formed prior to any order for the semiconductor memory device being received. The wiring pattern includes pairs of wiring lines (i.e., drain electrode DL and bit line BL) which are kept unconnected, the passivation layer is formed to cover this wiring pattern.

After a customer order is received, the opening OP is formed to expose portions of the wiring line pair selected according to data "1", for example, and metal material 16 is deposited on and connects the exposed portions of the paired wiring lines. Thus, according to the present invention, the number of manufacturing steps to be performed after desired data is written into the semiconductor device is considerably less than in the case of the conventional technique.

What is claimed is:

1. A programmable semiconductor device, capable of being programmed without fabricating a wiring layer, comprising:
    a semiconductor body;
    semiconductor elements in said semiconductor body;
    a wiring pattern on said semiconductor body for wiring said semiconductor elements, the wiring pattern including
        discontinuous portions, each discontinuous portion having a first section and a second section, and other portions; and
    an insulating layer covering said wiring pattern and defining a plurality of openings, each of the openings exposing a discontinuous portion having the first section electrically isolated from the second section.

2. A semiconductor device according to claim 1, wherein said discontinuous portions include first and second conductive layers arranged adjacent to each other.

3. A semiconductor device according to claim 2, wherein said opening each have a portion of said first conductive layer and a portion of said second conductive layer projecting into said openings.

4. A semiconductor device according to claim 3, wherein a distance between said first and second conductive layers is less than a thickness of said insulating layer.

5. A semiconductor device according to claim 4, wherein the distance between said first and second conductive layers is not more than a thicknesses of said first and second conductive layers.

6. A semiconductor device according to claim 2, wherein a distance between said first and second conductive layers is less than a thickness of said insulating layer.

7. A semiconductor device according to claim 2, wherein a distance between said first and second conductive layers is not more than a thicknesses of said first and second conductive layers.

8. A semiconductor device according to claim 1, wherein said semiconductor elements include MOS transistors each serving as a memory cell, said wiring pattern includes wiring lines for terminals of said MOS transistors, and said discontinuous portions are formed in the wiring lines for a predetermined terminal of said MOS transistor.

9. A semiconductor device according to claim 8, wherein said MOS transistor has a source and drain formed in a surface of said semiconductor body, and a gate formed over and insulated from a region of said semiconductor body located between said source and drain.

10. A semiconductor device according to claim 9, wherein said wiring lines include a first wiring line connected to supply a reading voltage to the gate of said MOS transistor, a second wiring line connected between a reference potential terminal and the source of said MOS transistor, and a third wiring line; said third wiring line including a metal layer connected to the drain of said MOS transistor and a metal layer connected to a power source terminal via a load circuit; and said discontinuous portion is formed of ends of said metal layers.

11. A programmable semiconductor device, capable of being programmed without fabricating a wiring layer, comprising:
    a semiconductor body;
    semiconductor elements in the semiconductor body;
    a wiring pattern on the semiconductor body for wiring said semiconductor elements, the wiring pattern including
        discontinuous portions, each discontinuous portion defining a space between a first section of a first material and a second section of the first material, the space being filled with a material different from the first material, and
        other portions; and
    an insulator covering the wiring pattern to fill the space defined by each one of the discontinuous portions.

12. A semiconductor device according to claim 11, wherein a distance between the first and second sections is less than a thickness of the insulator.

13. A semiconductor device according to claim 11, wherein a distance between the first and second sections is no greater than a thickness of the insulator.

14. A programmable semiconductor device according to claim 11, further including a power source, and wherein the semiconductor elements include
    MOS transistors coupled to the wiring pattern in a memory configuration, each MOS transistor having a current path, and wherein one of the discontinuous portions is coupled between the current path of one of the MOS transistors and the power source.

15. A programmable semiconductor device, capable of being programmed without fabricating a wiring layer, resulting from performing a process comprising the steps of:
    forming semiconductor elements on a semiconductor body;
    forming first portions of a wiring pattern on the semiconductor body, for wiring the semiconductor elements;
    forming N discontinuous portions of the wiring pattern on a layer of the semiconductor body; and
    covering the wiring pattern with an insulator to fill each one of the N discontinuous portions with the insulator, after the step of forming first portions of the wiring pattern.

* * * * *